(12) United States Patent
Watanabe et al.

(10) Patent No.: US 12,068,581 B2
(45) Date of Patent: Aug. 20, 2024

(54) SURFACE-EMITTING SEMICONDUCTOR LASER

(71) Applicant: SONY SEMICONDUCTOR SOLUTIONS CORPORATION, Kanagawa (JP)

(72) Inventors: Yoshiaki Watanabe, Kanagawa (JP); Takayuki Kawasumi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/192,071

(22) Filed: Mar. 29, 2023

(65) Prior Publication Data

US 2023/0246420 A1 Aug. 3, 2023

Related U.S. Application Data

(63) Continuation of application No. 16/766,285, filed as application No. PCT/JP2018/043192 on Nov. 22, 2018, now Pat. No. 11,652,333.

(30) Foreign Application Priority Data

Nov. 30, 2017 (JP) .................... 2017-230071

(51) Int. Cl.
*H01S 5/183* (2006.01)
*H01S 5/02* (2006.01)
*H01S 5/042* (2006.01)

(52) U.S. Cl.
CPC ........ *H01S 5/18311* (2013.01); *H01S 5/0206* (2013.01); *H01S 5/0421* (2013.01);
(Continued)

(58) Field of Classification Search
CPC .. H01S 5/18311; H01S 5/0206; H01S 5/0421; H01S 5/04254; H01S 5/04256; H01S 5/18347
See application file for complete search history.

(56) References Cited

U.S. PATENT DOCUMENTS 5,577,064 A * 11/1996 Swirhun ............... H01S 5/0424
257/85
6,343,090 B1 * 1/2002 Yoo ..................... H01S 5/04253
372/75
(Continued)

FOREIGN PATENT DOCUMENTS

JP 09-135049 A 5/1997
JP 09-260763 A 10/1997
(Continued)

OTHER PUBLICATIONS

Office Action for JP Patent Application No. 2019-557197, issued on Feb. 21, 2023, 03 pages of English Translation and 03 pages of Office Action.
(Continued)

*Primary Examiner* — Yuanda Zhang
(74) *Attorney, Agent, or Firm* — CHIP LAW GROUP

(57) ABSTRACT

A surface-emitting semiconductor laser includes a substrate, a first electrode in contact with the substrate, a first light reflection layer over the substrate, a second light reflection layer over the substrate, with the first light reflection layer between the second light reflection layer and the substrate, an active layer between the second light reflection layer and the first light reflection layer, a current confining layer between the active layer and the second light reflection layer and includes a current injection region, a second electrode over the substrate, with the second light reflection layer between the second electrode and the substrate, at least a portion of the second electrode is at a position overlapping (Continued)

the current injection region, and a contact layer between the second electrode and the second light reflection layer and includes a contact region in contact with the second electrode.

19 Claims, 13 Drawing Sheets

(52) U.S. Cl.
CPC ...... *H01S 5/04254* (2019.08); *H01S 5/04256* (2019.08); *H01S 5/18347* (2013.01)

(56) References Cited

U.S. PATENT DOCUMENTS

| | | |
|---|---|---|
| 2003/0016713 A1 | 1/2003 | Kaneko |
| 2004/0028103 A1 | 2/2004 | Ueki |
| 2004/0042519 A1 | 3/2004 | Sakamoto et al. |
| 2004/0184500 A1 | 9/2004 | Kuwata |
| 2005/0271106 A1* | 12/2005 | Watanabe ........... H01S 5/18388 372/43.01 |
| 2005/0286596 A1 | 12/2005 | Mukoyama et al. |

FOREIGN PATENT DOCUMENTS

| | | |
|---|---|---|
| JP | 2003-023211 A | 1/2003 |
| JP | 2004-079833 A | 3/2004 |
| JP | 2004-165667 A | 6/2004 |
| JP | 2006-066681 A | 3/2006 |
| JP | 2006-114915 A | 4/2006 |
| JP | 2014-007293 A | 1/2014 |
| WO | 2017/171841 A1 | 10/2017 |

OTHER PUBLICATIONS

Non-Final Office Action for U.S. Appl. No. 16/766,285, issued on Apr. 5, 2022, 10 pages.
Final Office Action for U.S. Appl. No. 16/766,285, issued on Oct. 7, 2022, 11 pages.
Notice of Allowance for U.S. Appl. No. 16/766,285, issued on Dec. 30, 2022, 08 pages.
International Search Report and Written Opinion of PCT Application No. PCT/JP2018/043192, issued on Feb. 5, 2019, 07 pages of English Translation and 07 pages of ISRWO.
International Preliminary Report on Patentability of PCT Application No. PCT/JP2018/043192, issued on Jun. 11, 2020, 08 pages of English Translation and 04 pages of IPRP.

\* cited by examiner

[FIG. 1]
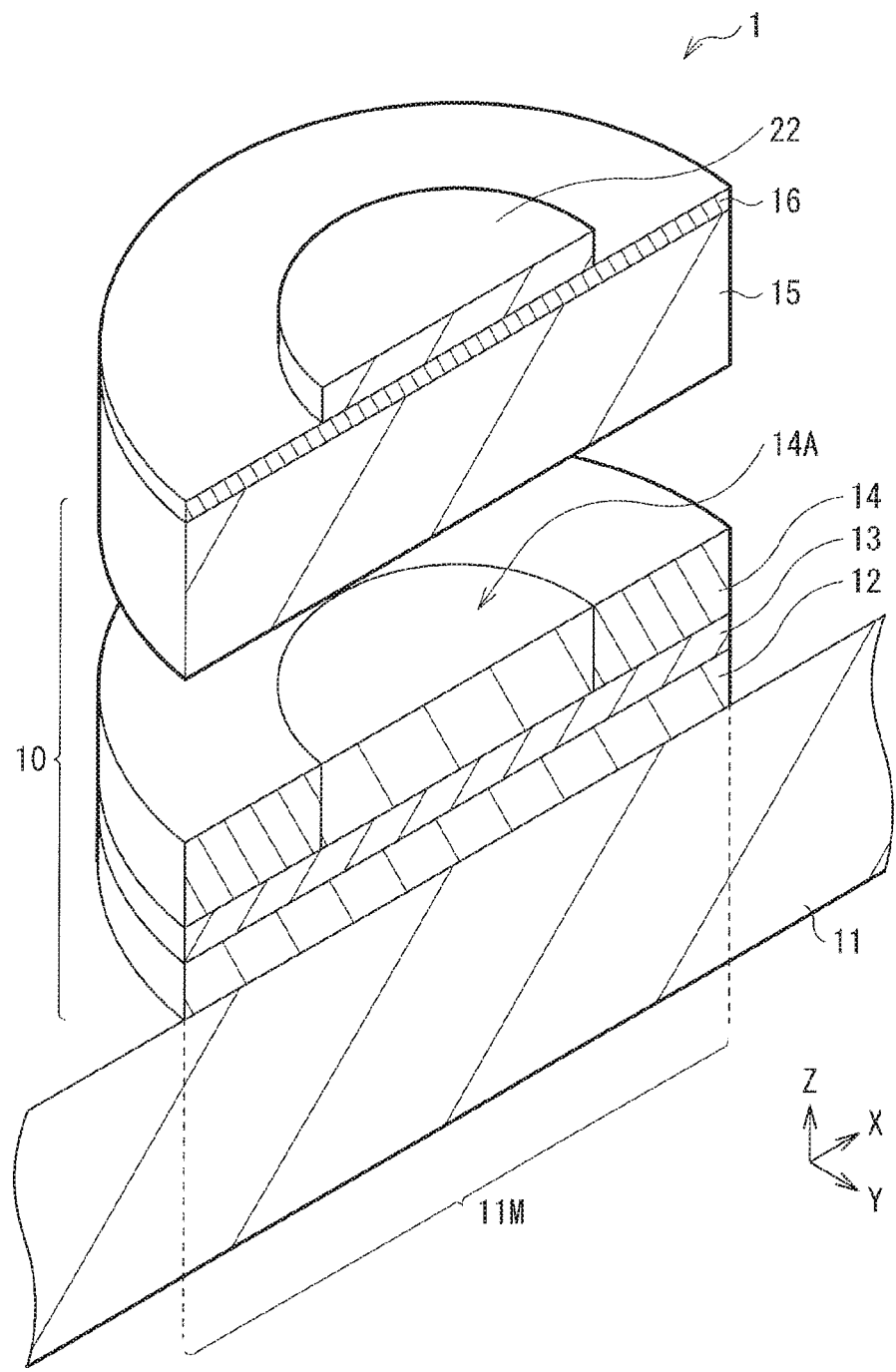

[FIG. 2]
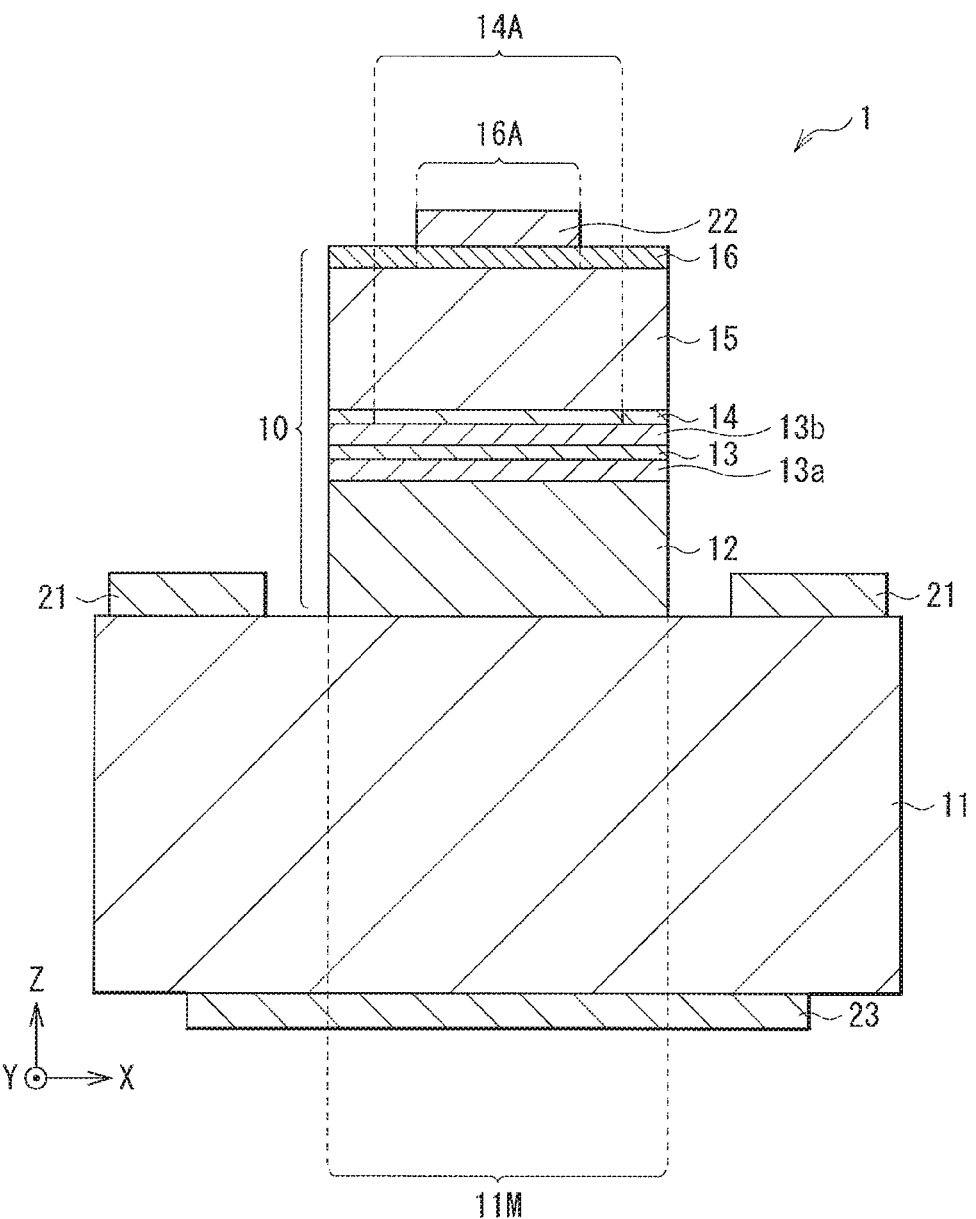

[ FIG. 3 ]
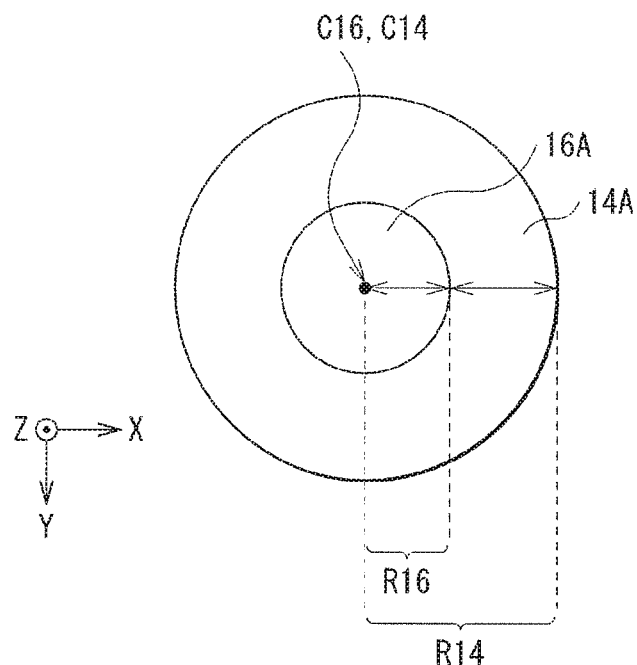
[ FIG. 4 ]
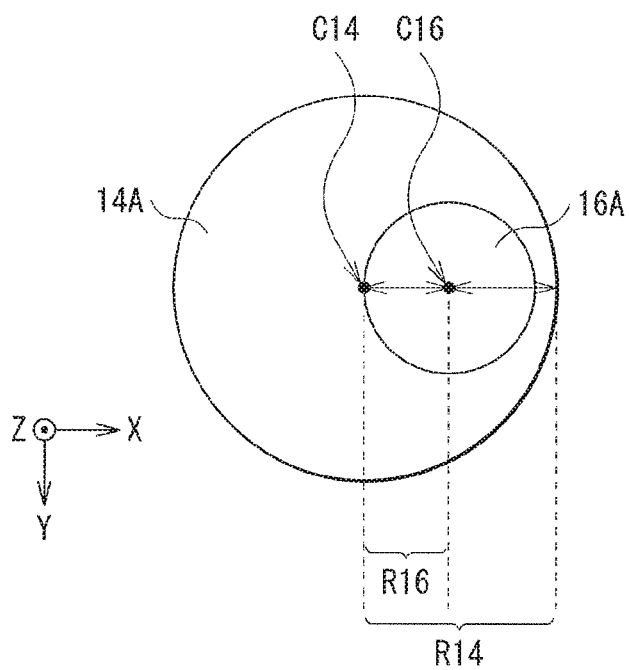

[ FIG. 5 ]
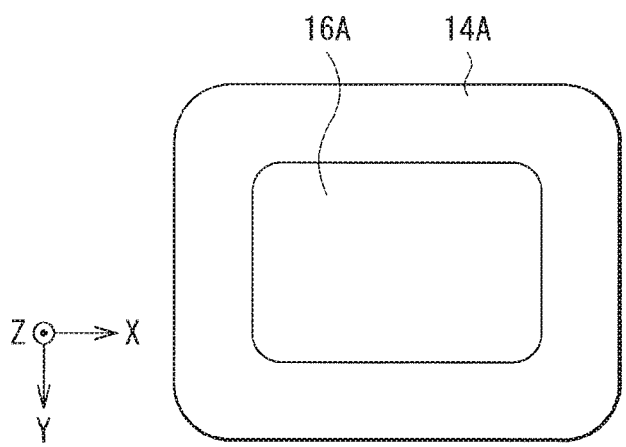
[ FIG. 6 ]
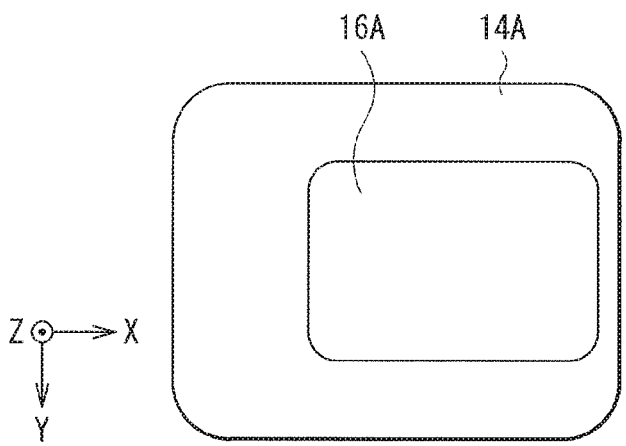

[FIG. 7]
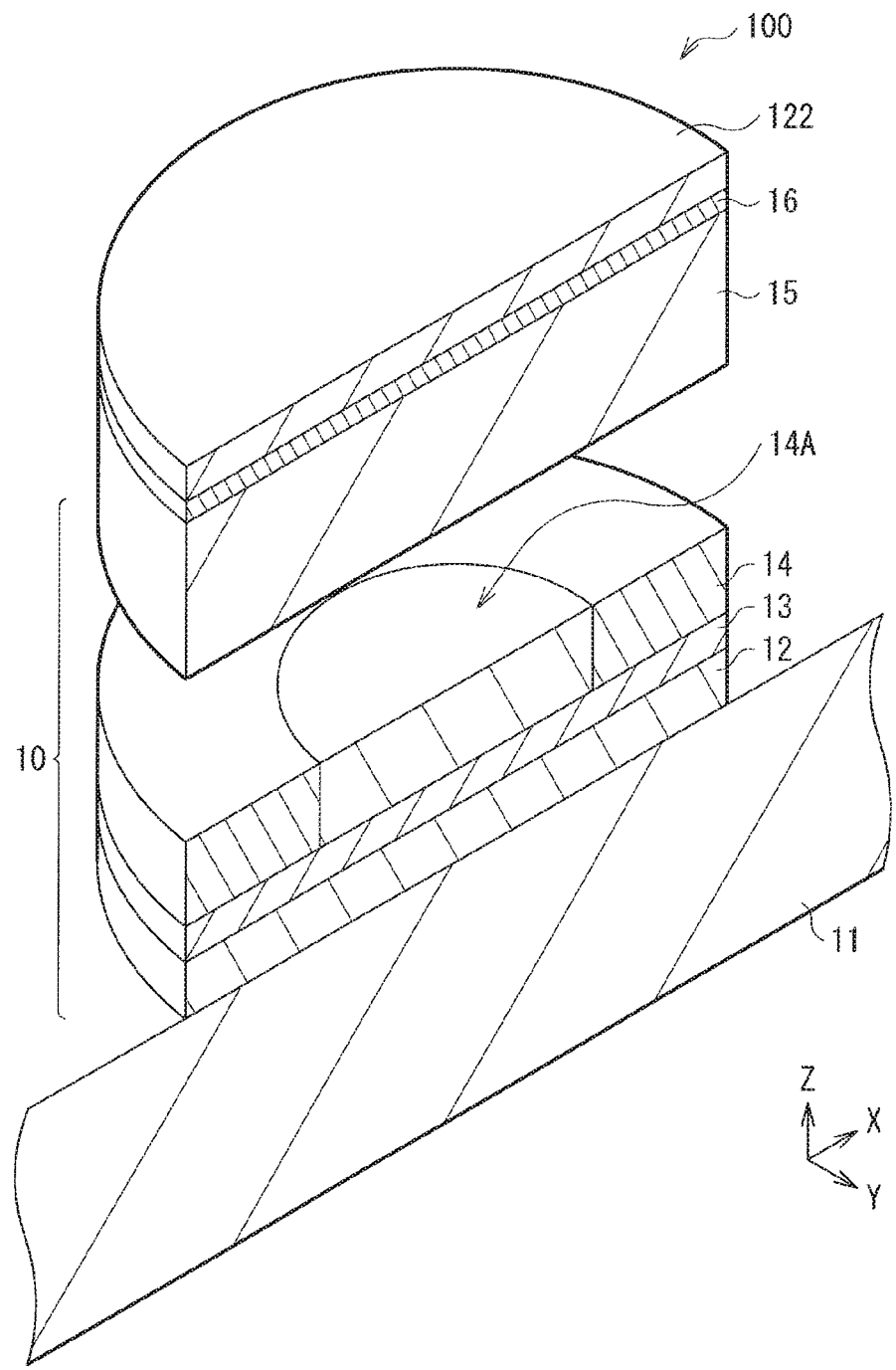

[FIG. 8]
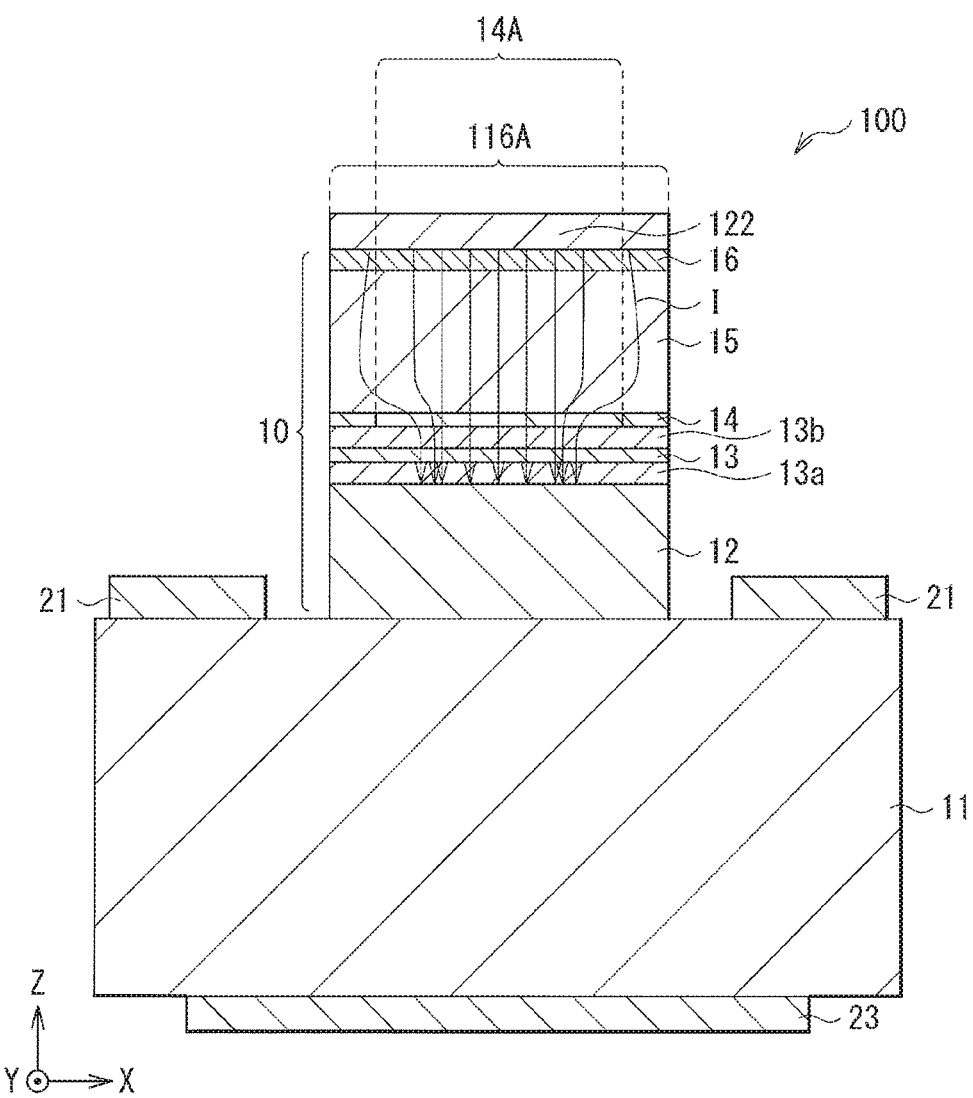

[ FIG. 9 ]
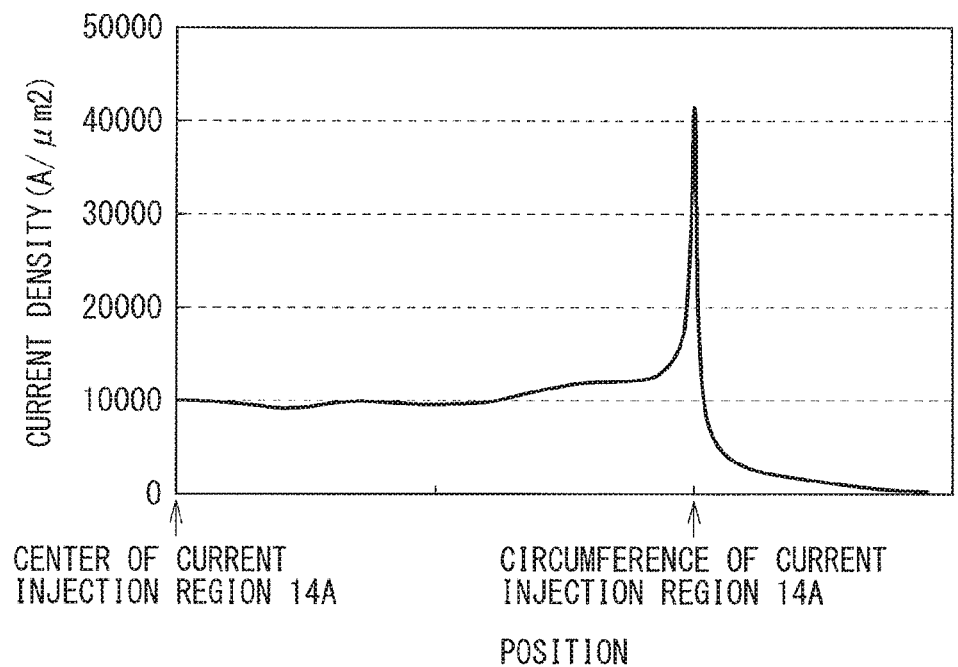
[ FIG. 10 ]
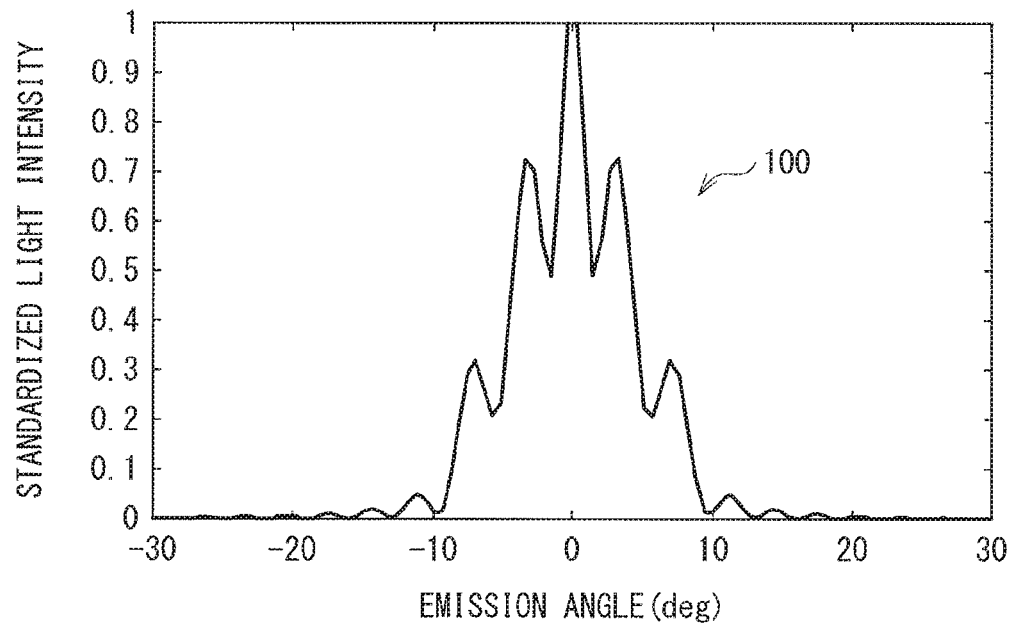

[ FIG. 11 ]
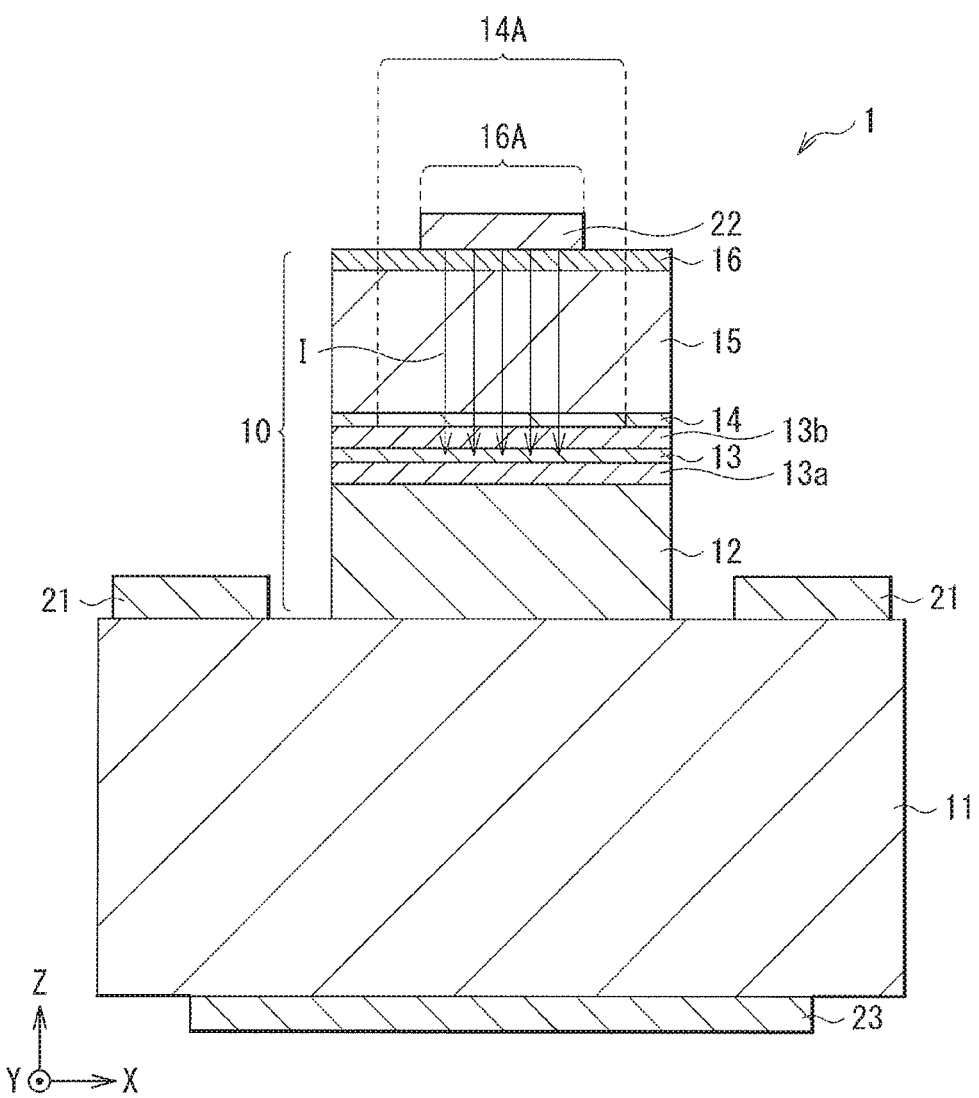

[ FIG. 12 ]
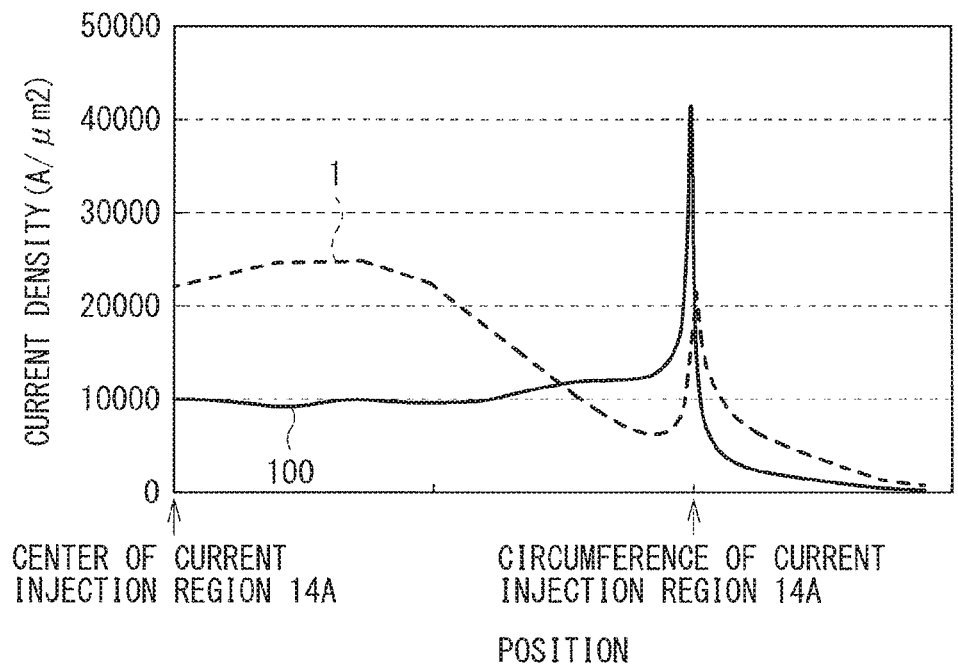
[ FIG. 13 ]
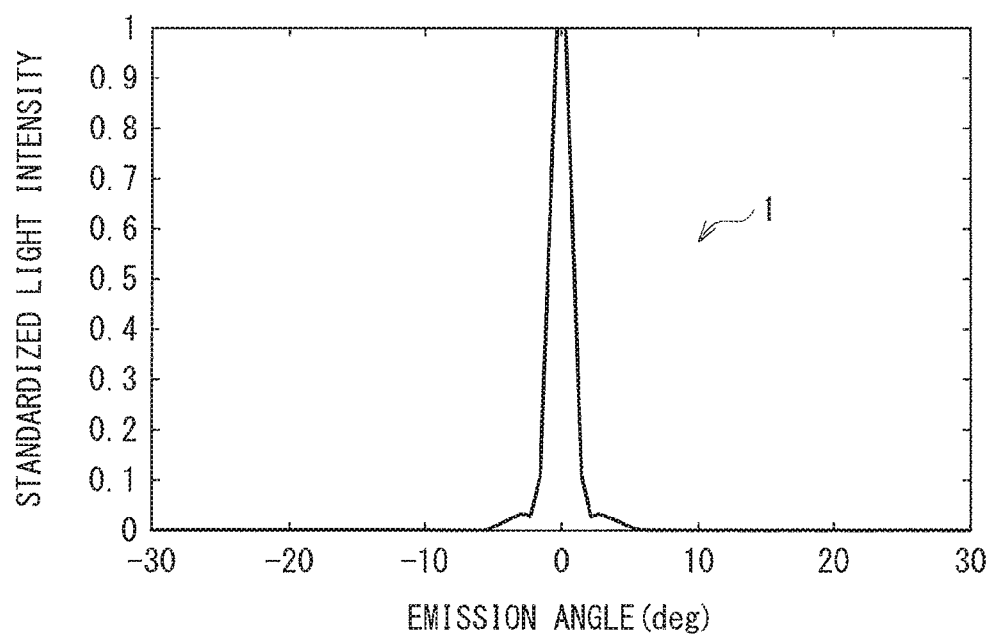

[ FIG. 14A ]
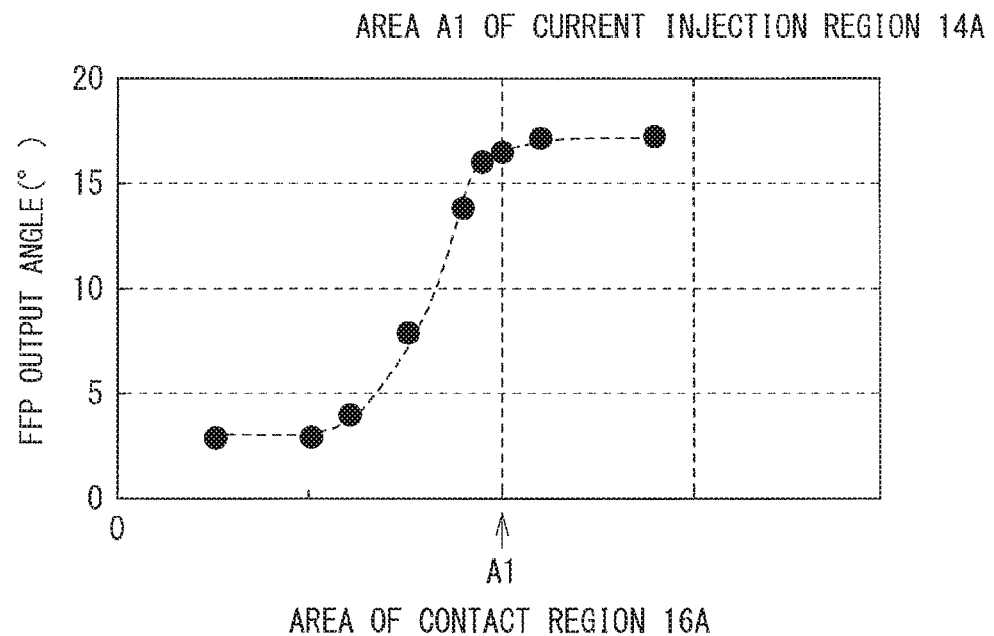
[ FIG. 14B ]
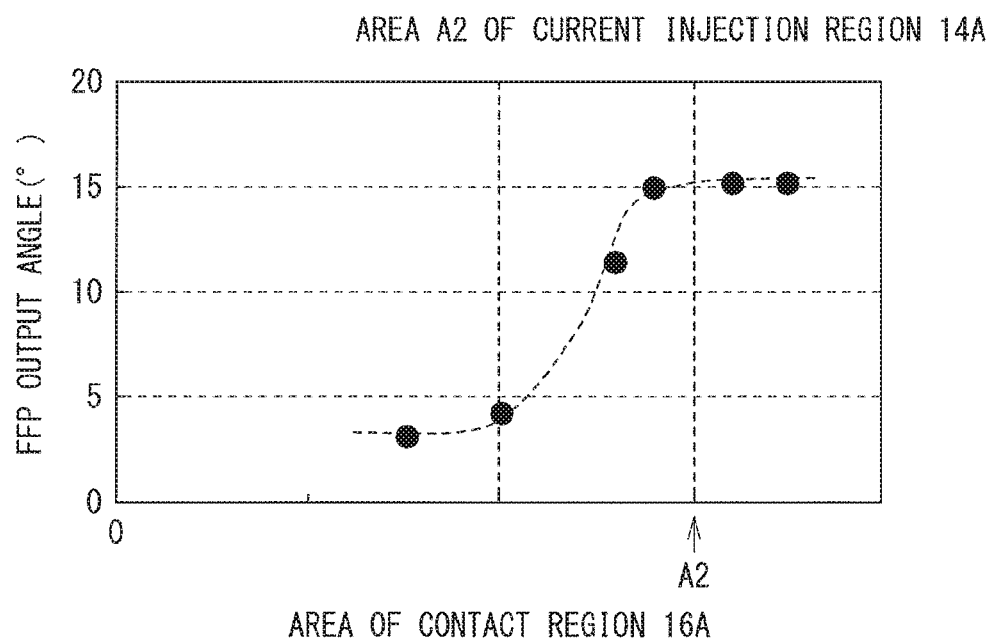

[ FIG. 15 ]
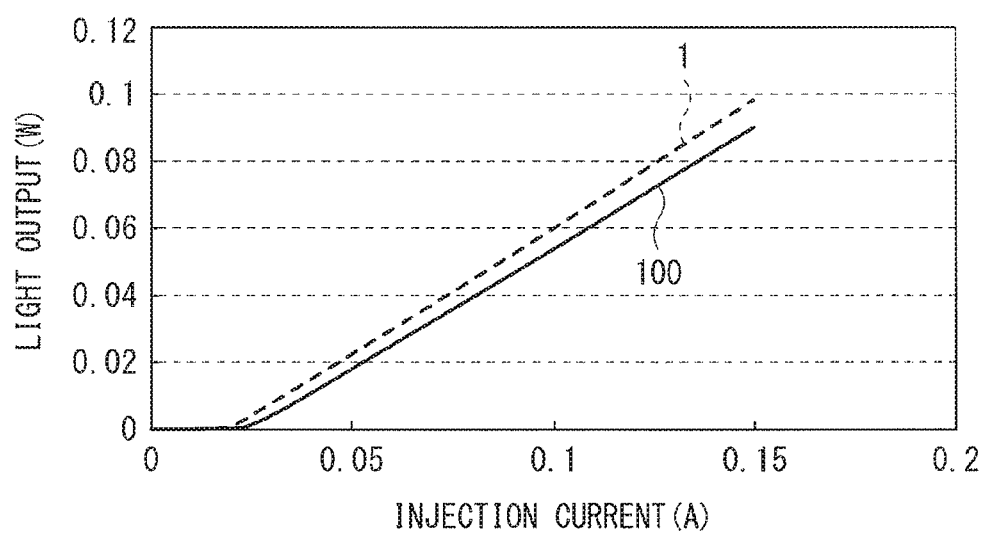

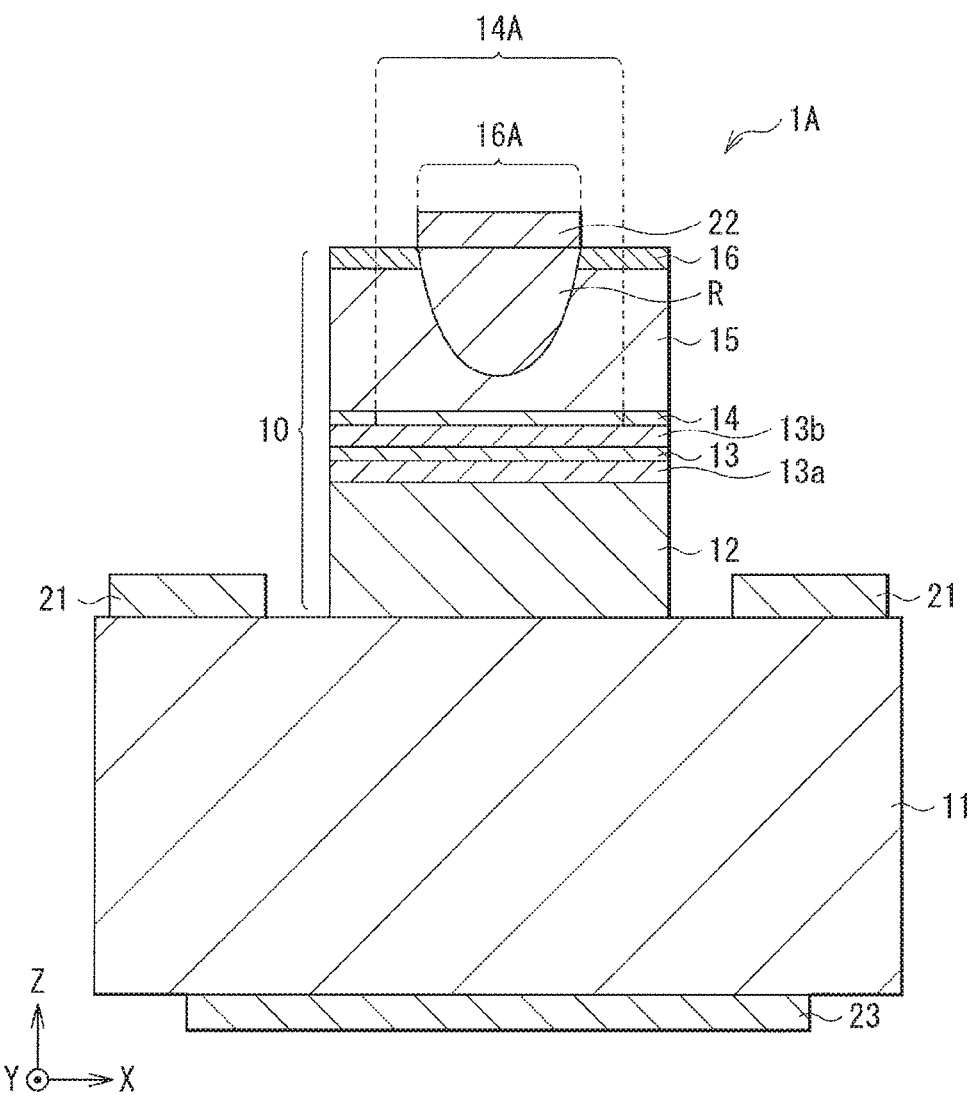
[FIG. 16]

[ FIG. 17 ]
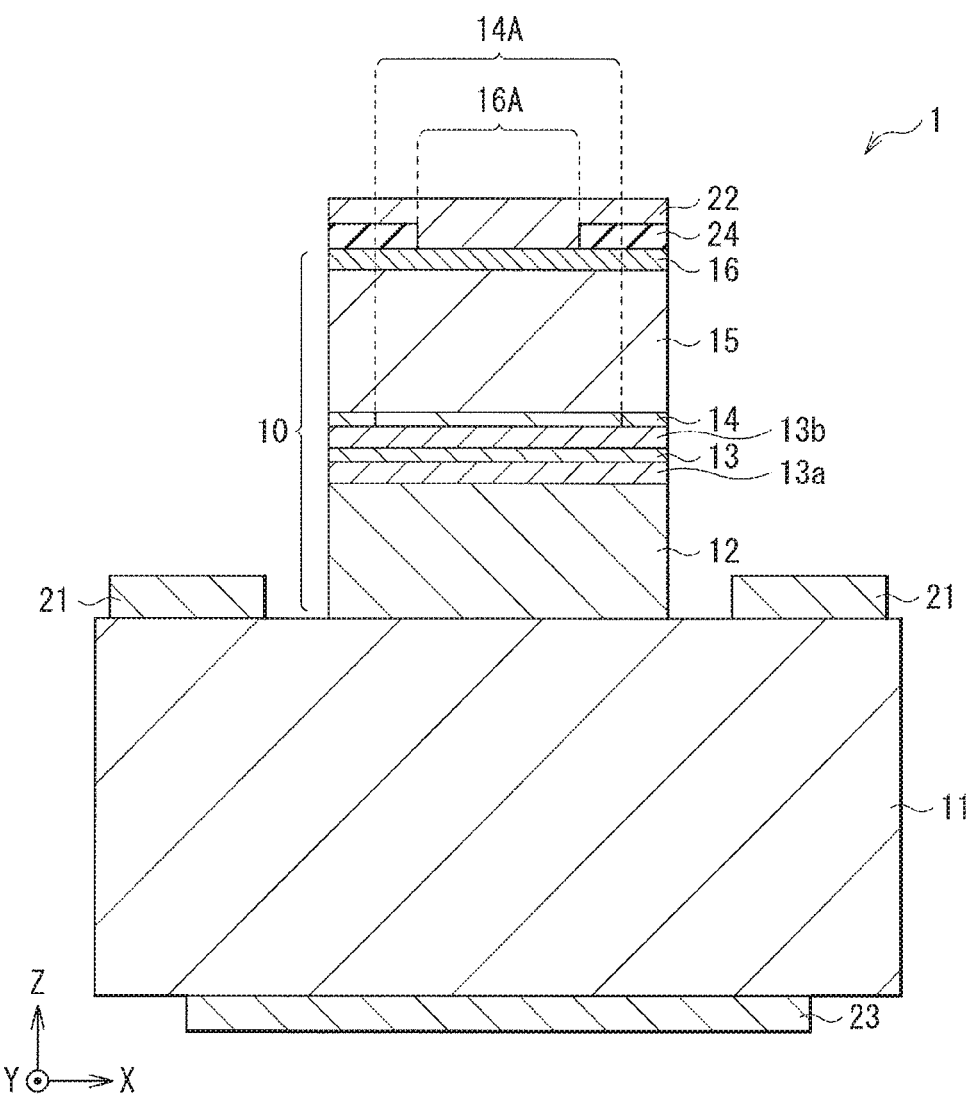

SURFACE-EMITTING SEMICONDUCTOR LASER

CROSS REFERENCE TO RELATED APPLICATIONS

This application is a continuation application of U.S. patent application Ser. No. 16/766,285 filed on May 21, 2020, which is a U.S. National Phase of International Patent Application No. PCT/JP2018/043192 filed on Nov. 22, 2018, which claims priority benefit of Japanese Patent Application No. JP 2017-230071 filed in the Japan Patent Office on Nov. 30, 2017. Each of the above-referenced applications is hereby incorporated herein by reference in its entirety.

TECHNICAL FIELD

The present technology relates to a surface-emitting semiconductor laser including a current confining layer.

BACKGROUND ART

The surface-emitting semiconductor lasers have many advantages over edge-emitting semiconductor lasers. Therefore, the surface-emitting semiconductor lasers have been under development (for example, see PTL 1). Examples of the surface-emitting semiconductor lasers include a VCSEL (Vertical Cavity Surface Emitting LASER).

CITATION LIST

Patent Literature

PTL 1: Japanese Unexamined Patent Application Publication No. 2006-114915

SUMMARY OF THE INVENTION

It has been desired to improve radiation characteristics of beams of the surface-emitting semiconductor lasers. Examples of the beams with high radiation characteristics include a beam having a single-peak intensity distribution profile, for example.

Therefore, it is desirable to provide a surface-emitting semiconductor laser that makes it possible to improve radiation characteristics of beams.

A surface-emitting semiconductor laser according to an embodiment of the present technology includes a substrate, a first electrode provided in contact with the substrate, a first light reflection layer provided over the substrate, a second light reflection layer provided over the substrate, with the first light reflection layer being interposed between the second light reflection layer and the substrate, an active layer provided between the second light reflection layer and the first light reflection layer, a current confining layer that is provided between the active layer and the second light reflection layer and includes a current injection region, a second electrode provided over the substrate, with the second light reflection layer being interposed between the second electrode and the substrate, at least a portion of the second electrode being provided at a position overlapping the current injection region, and a contact layer that is provided between the second electrode and the second light reflection layer and includes a contact region that is in contact with the second electrode, in which the contact region has a smaller area than an area of the current injection region.

In the surface-emitting semiconductor laser according to an embodiment of the present technology, the area of the contact region is smaller than the area of the current injection region. This makes it possible to increase current density around a center of the current injection region, and this makes it easy to cause oscillation in a low-order transverse mode.

In the surface-emitting semiconductor laser according to an embodiment of the present technology, the area of the contact region is smaller than the area of the current injection region. This makes it easy to obtain a beam having a single-peak intensity distribution profile. Accordingly, it is possible to improve radiation characteristics of beams.

It is to be noted that the above-described contents are mere examples of the present disclosure. The effects of the present disclosure are not limited to the description above, and the effects of the present disclosure may be other effects, or may further include other effects.

BRIEF DESCRIPTION OF THE DRAWINGS

FIG. 1 is a perspective half-sectional view of a schematic configuration of a semiconductor laser according to an embodiment of the present technology.

FIG. 2 is a diagram schematically illustrating a cross-sectional configuration of the semiconductor laser illustrated in FIG. 1.

FIG. 3 is a plan view schematically illustrating a configuration of a current injection region and a contact region illustrated in FIG. 2.

FIG. 4 is a plan view schematically illustrating another example (1) of the configuration of the current injection region and the contact region illustrated in FIG. 3.

FIG. 5 is a plan view schematically illustrating another example (2) of the configuration of the current injection region and the contact region illustrated in FIG. 3.

FIG. 6 is a plan view schematically illustrating another example (3) of the configuration of the current injection region and the contact region illustrated in FIG. 3.

FIG. 7 is a perspective half-sectional view of a schematic configuration of a semiconductor laser according to a comparative example.

FIG. 8 is a diagram schematically illustrating electric currents injected from a second electrode of the semiconductor laser illustrated in FIG. 7.

FIG. 9 is a diagram illustrating a relationship between current densities and positions in a current injection region illustrated in FIG. 8.

FIG. 10 is a diagram illustrating radiation characteristics of light emitted by the semiconductor laser illustrated in FIG. 7.

FIG. 11 is a diagram schematically illustrating electric currents injected from a second electrode of the semiconductor laser illustrated in FIG. 1.

FIG. 12 is a diagram illustrating a relationship between current densities and positions in a current injection region illustrated in FIG. 11.

FIG. 13 is a diagram illustrating radiation characteristics of light emitted by the semiconductor laser illustrated in FIG. 1.

FIG. 14A is a diagram illustrating a relationship (1) between an area of the contact region and output angles of a FFP (Far Field Pattern).

FIG. 14B is a diagram illustrating a relationship (2) between the area of the contact region and the output angles of the far-field pattern (FFP).

FIG. 15 is a diagram illustrating relationships between injected currents and light outputs with regard to the respective semiconductor lasers illustrated in FIG. 1 and FIG. 7.

FIG. 16 is a diagram schematically illustrating a cross-sectional configuration of a semiconductor laser according to a modification.

FIG. 17 is a diagram schematically illustrating another example of the cross-sectional configuration of the semiconductor laser illustrated in FIG. 2 or the like.

MODES FOR CARRYING OUT THE INVENTION

Next, with reference to drawings, details of an embodiment of the present technology are described. It is to be noted that, the description is given in the following order.

1. First Embodiment

Semiconductor laser in which area of contact region is smaller than area of current injection region 2. Modification Example in which second light reflection layer includes diffusion region Embodiment FIG. 1 and FIG. 2 each illustrate a schematic configuration of a surface-emitting semiconductor laser (a semiconductor laser 1) according to an embodiment of the present technology. FIG. 1 illustrates a partial cross-sectional configuration of the semiconductor laser 1 viewed from an obliquely upward direction. FIG. 2 illustrates an enlarged cross-sectional configuration of the portion illustrated in FIG. 1. The semiconductor laser 1 includes a stacked structure 10 of semiconductors on one surface (a front surface) of a substrate 11, and includes an antireflective film 23 on the other surface (a back surface) of the substrate 11. The stacked structure 10 is provided in a mesa region 11M of the substrate 11, and includes a first light reflection layer 12, an active layer 13, a current confining layer 14, a second light reflection layer 15, and a contact layer 16 in this order from substrate 11 side. The semiconductor laser 1 includes a first electrode 21 and a second electrode 22. The first electrode 21 is in contact with the substrate 11, and the second electrode 22 is in contact with the contact layer 16. In the semiconductor laser 1, light generated in the stacked structure 10 provided on the front surface side of the substrate 11 comes out from the back surface side of the substrate 11. Therefore, the semiconductor laser 1 is a so-called back-emitting VCSEL.

The substrate 11 includes a gallium arsenide (GaAs) substrate, for example. The substrate 11 includes material that is highly transparent to the light generated in the stacked structure 10 (more specifically, the active layer 13). The substrate 11 may include indium phosphide (InP), gallium nitride (GaN), indium gallium nitride (InGaN), sapphire, silicon (Si), silicon carbide (SiC), or the like.

The mesa region 11M is provided in a selective region in the substrate 11. The mesa region 11M includes the stacked structure 10 that has been subjected to etching to have a predetermined shape. A planar shape (an XY-plane in FIG. 1) of the mesa region 11M is a circular shape, for example. The mesa region 11M includes the stacked structure 10 having a substantially cylindrical shape. The substrate 11 may include a plurality of the mesa regions 11M. The respective stacked structures 10 provided in the plurality of mesa regions 11M are apart from each other.

The first light reflection layer 12 provided on the front surface of the substrate 11 is a DBR (Distributed Bragg Reflector) layer interposed between the substrate 11 and the active layer 13. The first light reflection layer 12 opposes the second light reflection layer 15 with the active layer 13 interposed therebetween. The first light reflection layer 12 is configured to resonate the light generated in the active layer 13, between the first light reflection layer 12 and the second light reflection layer 15.

The first light reflection layer 12 has a stacked structure in which a low refractive index layer and a high refractive index layer are alternately stacked on each other. The low refractive index layer is n-type $Al_{X1}Ga_{(1-X1)}As$ ($0<X1<1$) having an optical film thickness of $\lambda/4$, for example. $\lambda$ represents an oscillation wavelength of the semiconductor laser 1. The high refractive index layer is n-type $Al_{X2}Ga_{(1-X2)}As$ ($0 \leq X2 < X1$) having an optical film thickness of $\lambda/4$, for example.

The active layer 13 provided between the first light reflection layer 12 and the second light reflection layer 15 includes aluminum gallium arsenide (AlGaAs)-based semiconductor material, for example. The active layer 13 is configured to receive electrons injected from the second electrode 22 via the current confining layer 14 (specifically, a current injection region 14A to be described later) and generate dielectric emission light. For example, undoped $Al_{X4}Ga_{(1-X4)}As$ ($0 \leq X4 < 1$) is usable as the active layer 13. The active layer 13 may have a multi quantum well (MQW) structure of GaAs and AlGaAs, for example. The active layer 13 may have a multi quantum well structure of InGaAs and AlGaAs.

It is also possible to provide a first spacer layer 13a between the first light reflection layer 12 and the active layer 13 (FIG. 2). The first spacer layer 13a may include n-type $Al_{X3}Ga_{(1-X3)}As$ ($0 \leq X3 < 1$), for example. Examples of n-type impurities include silicon (Si), selenium (Se), and the like.

It is also possible to provide a second spacer layer 13b between the active layer 13 and the current confining layer 14 (FIG. 2). The second spacer layer 13b may include p-type $Al_{X5}Ga_{(1-X5)}As$ ($0 \leq X5 < 1$), for example. Examples of p-type impurities include carbon (C), zinc (Zn), magnesium (Mg), beryllium (Be), and the like.

The active layer 13, the first spacer layer 13a, and the second spacer layer 13b may include semiconductor material of aluminum indium gallium arsenide (AlInGaAs)-based, aluminum gallium indium phosphorus (AlGaInP)-based, aluminum indium gallium nitride (AlInGaN)-based, or the like in accordance with constituent material of the substrate 11, for example.

The current confining layer 14 provided between the active layer 13 and the second light reflection layer 15 has a substantially circular current injection region 14A at a central part of the mesa region 11M in plan view (in the XY-plane in FIG. 1), for example (FIG. 1 and FIG. 3 described later). A portion of circumference side of the mesa region 11M in the current confining layer 14 has high resistance, and is a current confining region. For example, the portion of the circumference side of the current confining layer 14 is oxidized and thereby have high resistance. The current injection region 14A is provided in a manner that the current injection region 14A is surrounded by the current confining region. By providing the current confining layer 14 in such a way, it is possible to confine electric currents injected into the active layer 13 by the second electrode 22 and increase current injection efficiency. This makes it possible to reduce a threshold current. The radius R14 (FIG. 3) of the substantially circular current injection region 14A is 20 µm to 50 µm, for example.

The current confining layer 14 includes p-type $Al_{X6}Ga_{(1-X6)}As$ (0≤X6<1), for example. The current confining region is formed by oxidizing $Al_{X6}Ga_{(1-X6)}As$ from the circumference of the mesa region 11M. The current confining region includes aluminum oxide ($AlO_X$), for example. A portion of the second light reflection layer 15 may also be provided between the second spacer layer 13b and the current confining layer 14.

The second light reflection layer 15 is a DBR layer provided between the current confining layer 14 and the contact layer 16. The second light reflection layer 15 opposes the first light reflection layer 12 with the active layer 13 and the current confining layer 14 interposed therebetween. The second light reflection layer 15 has a stacked structure in which a low refractive index layer and a high refractive index layer are alternately stacked on each other. The low refractive index layer is p-type $Al_{X7}Ga_{(1-X7)}As$ (0<X7<1) having an optical film thickness of λ/4, for example. The high refractive index layer is p-type $Al_{X8}Ga_{(1-X8)}As$ (0≤X8<X7) having an optical film thickness of λ/4, for example.

The contact layer 16 is provided between the second light reflection layer 15 and the second electrode 22. The contact layer 16 includes a contact region 16A in a region overlapping the current injection region 14A in the plan view (the XY-plane in FIG. 2). The contact region 16A is provided at the central part of the contact layer 16 in the plan view, for example. The second electrode 22 is in contact with the contact region 16A in the contact layer 16. In other words, the contact region 16A is a region in which the second electrode 22 is in contact with the stacked structure 10.

FIG. 3 illustrates a shape of the contact region 16A in the plan view (the XY-plane) with the current injection region 14A. The contact region 16A has a substantially circular shape in the plan view, for example. For example, the contact region 16A is provided in a manner that the whole area of the contact region 16A overlaps the current injection region 14A. The contact region 16A is preferably provided at a position at which the center (a center C16) of the contact region 16A overlaps the center (a center C14) of the current injection region 14A in plan view. In other words, the contact region 16A is preferably concentric with the current injection region 14A.

In the present embodiment, the area of the contact region 16A is smaller than the area of the current injection region 14A. This makes it possible to increase current density of electric currents injected by the second electrode 22 near the center of the current injection region 14A and this makes it easy to cause oscillation in a low-order transverse mode. Details thereof are described later. The radius R16 of the substantially circular contact region 16A is 5 µm to 15 µm, for example. The area of the contact region 16A is preferably less than or equal to the half of the area of the current injection region 14A.

FIG. 4 illustrates another example of placing the contact region 16A and the current injection region 14A. The contact region 16A is preferably provided at a position at which the center C16 of the contact region 16A is close to the center C14 of the current injection region 14A in plan view. However, it is also possible to provide the contact region 16A in a manner that the center C16 of the contact region 16A is shifted from the center C14 of the current injection region 14A.

As illustrated in FIG. 5 and FIG. 6, the contact region 16A and the current injection region 14A may have substantially rectangular shapes in plan view. In this case, for example, the lengths of all sides of the contact region 16A are shorter than the lengths of sides of the current injection region 14A. The contact region 16A and the current injection region 14A may have triangular shapes, or polygonal shapes having five or more sides in plan view. In other words, the contact region 16A and the current injection region 14A may have substantially circular shapes or polygonal shapes in plan view.

The contact layer 16 with such a contact region 16A includes p-type $Al_{X6}Ga_{(1-X9)}As$ (0≤X9<1), for example. The contact layer 16 may be a portion of the second light reflection layer 15. The portion of the second light reflection layer 15 is a closest part to the second electrode 22.

The second electrode 22 installed on the stacked structure 10 is provided in a region in which at least a portion of the second electrode 22 overlaps the current injection region 14A in plan view. The second electrode 22 has substantially the same shape as the shape of the contact region 16A in plan view, for example. The second electrode 22 has a substantially circular shape having substantially the same radius as the radius of the contact region 16A in plan view, for example. The second electrode 22 is provided in the contact region 16A. The second electrode 22 includes a metal film such as gold (Au), germanium (Ge), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), indium (In), or the like for example. The second electrode 22 may include a single-layered metal film or may include a metal film having a stacked structure.

The first electrode 21 is provided in contact with the front surface of the substrate 11, for example. For example, the first electrode 21 is provided outside the mesa region 11M in a manner that the first electrode 21 surrounds the mesa region 11M. The first electrode 21 is an annular electrode, for example. The first electrode 21 may be provided in contact with the back surface of the substrate 11. The first electrode 21 includes a metal film such as gold (Au), germanium (Ge), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), indium (In), or the like, for example. The first electrode 21 may include a single-layered metal film or may include a metal film having a stacked structure.

The antireflective film 23 attached to the back surface of the substrate 11 is provided in a manner that the antireflective film 23 opposes the stacked structure 10. The antireflective film 23 is configured to suppress reflection of light at the back surface of the substrate 11 and efficiently extract light from the back surface of the substrate 11. The antireflective film 23 includes silicon oxide ($SiO_2$), silicon nitride (SiN), or the like, for example.

Such a semiconductor laser 1 is produced as described below, for example.

First, the first light reflection layer 12, the first spacer layer 13a, the active layer 13, the second spacer layer 13b, the current confining layer 14, the second light reflection layer 15, and the contact layer 16 are stacked on the substrate 11 in this order. This layered product is formed through an epitaxial crystal growth method using molecular-beam epitaxy (MBE), metalorganic chemical vapor deposition (MOCVD), or the like, for example.

Next, for example, a flat circular resist film is formed on the contact layer 16. Using the resist film as a mask, etching is performed from the contact layer 16 to the first light reflection layer 12 while. The etching is performed by reactive-ion etching (RIE), for example. This makes it possible to form the substantially cylindrical stacked structure 10 in the mesa region 11M on the substrate 11. After the etching, the resist film is removed.

Next, the current confining layer 14 is subjected to oxidation treatment at high temperature in a water-vapor atmosphere. The oxidation treatment makes it possible to form the current confining region in a certain region starting from the circumference of the mesa region 11M, and form the current injection region 14A at the central part of the mesa region 11M. Subsequently, the second electrode 22 is formed in the contact region 16A on the contact layer 16, and the first electrode 21 is formed in the front surface of the substrate 11. Finally, the substrate 11 is thinned, and the semiconductor laser 1 is completed.

Operation

When predetermined voltage is applied between the first electrode 21 and the second electrode 22 in the semiconductor laser 1, electric currents confined by the current confining layer 14 are injected into the active layer 13 via the current injection region 14A. This makes it possible to emit light through electron-hole recombination. The light is reflected between the first light reflection layer 12 and the second light reflection layer 15, travels therebetween, generates laser oscillation at a predetermined wavelength, and is extracted as laser light from the first light reflection layer 12 (substrate 11) side. For example, respective beams of light emitted from a plurality of the mesa regions 11M overlap each other and the overlapped beams of light are extracted from the semiconductor laser 1.

Workings and Effects

In the semiconductor laser 1 according to the present embodiment, the area of the region in which the second electrode 22 is in contact with the stacked structure 10, that is, the area of the contact region 16A is smaller than the area of the current injection region 14A. This makes it possible to increase current density around the center of the current injection region 14A, and this makes it easy to cause oscillation in a low-order transverse mode. Hereinafter, such workings and effects are described with reference to a comparative example.

FIG. 7 and FIG. 8 each schematically illustrate a configuration of a semiconductor laser (a semiconductor laser 100) according to the comparative example. In the semiconductor laser 100, light generated in the active layer 13 is extracted from the substrate 11 side. In other words, the semiconductor laser 100 is a back-emitting semiconductor laser. In the semiconductor laser 100, a second electrode (a second electrode 122) is in contact with a whole surface of the contact layer 16, and a contact region (a contact region 116A) includes the whole area of the contact layer 16. The area of the contact region 116A is larger than the area of the current injection region 14A. This is a difference between the semiconductor laser 100 and the semiconductor laser 1.

In the semiconductor laser 100, electric currents I (FIG. 8) injected from vicinity of a circumference of the second electrode 122 concentrate around the circumference of the current injection region 14A. Therefore, current density around the circumference of the current injection region 14A is likely to be higher than current density at the center of the current injection region 14A.

FIG. 9 is a calculated result of a relationship between current densities and positions in the current injection region 14A in the semiconductor laser 100. As illustrated in FIG. 9, it is recognized that the current density around the circumference of the current injection region 14A is higher than the current density at the center of the current injection region 14A in the semiconductor laser 100.

When the current density around the circumference of the current injection region 14A is high, oscillation in a high-order transverse mode has an advantage over the oscillation in the low-order transverse mode, and beams resulting from the oscillation in the high-order transverse mode are generated. Examples of the transverse mode include an LP mode (Linearly Polarized Mode). The beams resulting from the oscillation in the high-order transverse mode have a multiple-peak intensity distribution profile, or a wide emission angle, for example. In particular, when the current injection region 14A has a large area, many high-order transverse modes are permitted. This makes it easy to generate the beams resulting from the oscillation in the high-order transverse modes.

FIG. 10 illustrates an example of light intensity distribution of beams emitted from the semiconductor laser 100. The beams emitted from the semiconductor laser 100 have a multiple-peak intensity distribution profile as illustrated in FIG. 10. In addition, the beams have wide emission angles.

In a case where the current injection region 14A has a small area, the oscillation in the low-order transverse mode tends to have an advantage. Therefore, it is also possible to connect a plurality of the stacked structures 10 including the current injection regions 14A each having a small area in parallel and output prescribed light. For example, approximately several hundreds to a thousand of stacked structures 10 including substantially circular current injection regions 14A each having a radius of 4 μm or less are connected in parallel. This makes it possible to cause all the stacked structures 10 to simultaneously emit light. Therefore, it is necessary for the respective stacked structures 10 to have same light output characteristics, and it is necessary to surely connect the plurality of stacked structures 10.

However, it is difficult to prepare the plurality of current injection regions 14A of the same size on a wafer surface due to oxidation process characteristics, because the radius of the current injection regions 14A is as small as approximately 4 μm. Accordingly, a yield may decrease when the approximately several hundred to thousand stacked structures 10 are connected in parallel as described above. In addition, the stacked structures 10 have heights of approximately several μm, for example. It is difficult to form an embedded structure of such a height in which the heights of all the stacked structures 10 are uniform. In addition, it is also difficult to form all the stacked structures 10 having uniform openings for connecting the first electrode 21 to the second electrode 122. In addition, it is also difficult to completely eliminate breaks caused by unevenness. As described above, it is difficult to surely connect several hundred or more stacked structures 10, and the yield may decrease.

On the other hand, as illustrated in FIG. 11, the area of the contact region 16A in the semiconductor laser 1 according to the present embodiment is smaller than the area of the current injection region 14A. Therefore, the electric currents I injected from the second electrode 22 concentrate around the center of the current injection region 14A.

FIG. 12 illustrates a calculation result of a relationship between current densities and positions in the current injection region 14A in the semiconductor laser 1. FIG. 12 also illustrates a result of the semiconductor laser 100 illustrated in FIG. 9 in addition to the result of the semiconductor laser 1. In the semiconductor laser 1 including the smaller contact region 16A, current density around the center of the current injection region 14A is higher than the circumference of the current injection region 14A.

This makes it possible to give an advantage on oscillation in the low-order transverse mode, or more specifically, a 0-th-order mode (an LP01 mode), and the semiconductor laser 1 emits beams resulting from the oscillation in the 0-th-order mode.

FIG. 13 illustrates light intensity distribution of beams emitted from the semiconductor laser 1. The beams emitted from the semiconductor laser 1 have a single-peak intensity distribution profile as illustrated in FIG. 13. In addition, the beams have small emission angles. For example, the size of the current injection region 14A of the semiconductor laser 1 (FIG. 13) is the same as that of the semiconductor laser 100 (FIG. 10). Therefore, it is possible for the semiconductor laser 1 to emit beams having the single-peak intensity distribution profile even in a case where the current injection region 14A has a large area.

FIG. 14A illustrates a relationship between a size of the area of the contact region 16A and output angles of an FFP obtained in a case where an area of the current injection region 14A is an area A1, and FIG. 14B illustrates a relationship between a size of the area of the contact region 16A and the output angles of the FFP obtained in a case where the area of the current injection region 14A is an area A2 (A1 and A2 are values of the area of the current injection region 14A, and satisfy a relationship of A1<A2). In this manner, it is recognized that the output angle of the FFP decreases when the area of the contact region 16A is smaller than the area of the current injection region 14A.

FIG. 15 illustrates calculation results of relationships between light output and injection currents of the semiconductor lasers 1 and 100. The semiconductor laser 1 makes it possible to obtain similar output as the semiconductor laser 100.

As described above, the area of the contact region 16A in the semiconductor laser 1 is smaller than the area of the current injection region 14A. This gives an advantage on oscillation in the low-order transverse mode even in a case where the current injection region 14A has a large area. Therefore, it is possible to achieve high output power by increasing the area of the current injection region 14A, and it is also possible to emit beams having a single-peak intensity distribution profile resulting from the oscillation in the low-order transverse mode. In addition, the increase in the area of the current injection region 14A makes it possible to drastically reduce the number of stacked structures 10 connected to each other. This makes it easy for the respective stacked structures 10 to have uniform light output characteristics, and this makes it possible to increase the yield.

As described above, according to the present embodiment, the area of the contact region 16A is smaller than the area of the current injection region 14A. This makes it easier to obtain beams having a single-peak intensity distribution profile. Accordingly, it is possible to improve radiation characteristics of the beams. In addition, even in a case where the current injection region 14A has a large area, the oscillation in the low-order transverse mode tends to have an advantage. This makes it possible to achieve both high output power and improvement in radiation characteristics.

In addition, when the plurality of stacked structures 10 is connected in parallel, it is easier for the respective stacked structures 10 to have uniformed light output characteristics. In addition, it is also possible to improve the yield.

In addition, it is also possible to use the semiconductor laser 1 to cause the plurality of stacked structures 10 to independently emit light, and, for example, change irradiation light patterns over time. In the independently driving-use, a structure of wiring lines and the like become complicated. However, when using the semiconductor laser 1 that achieves high output power and single transverse-mode oscillation, it is possible to reduce the number of stacked structures 10 used for achieving same light output, as compared to the semiconductor laser 100, for example. Therefore, it is possible to design with an allowance wiring lines even in a case of independently driving the stacked structures 10.

In addition, with an increase in the area of the current injection region 14A, light output from each of the stacked structures 10 increases. Therefore, for example, this makes it easier to adjust the number of stacked structures 10 to match their individual driving patterns. Accordingly, it is possible to design the semiconductor laser 1 more freely.

In addition, when using the semiconductor laser 1, it is possible to suppress concentration of electric currents around the circumference of the current injection region 14A as compared to the semiconductor laser 100. This makes it possible to suppress deterioration around the circumference of the current injection region 14A resulting from the concentration of electric currents, and this makes it possible to improve reliability.

In addition, a production process of the semiconductor laser 1 is substantially the same as a production process of the semiconductor laser 100. For example, it is only necessary to form the second electrode 22 instead of the second electrode 122 of the semiconductor laser 100. The second electrode 22 is smaller than the second electrode 122. In other words, it is not necessary to add any production process or make any special change or the like in the production process, and it is possible to easily produce the semiconductor laser 1.

In addition, in the back-emitting semiconductor laser 1, front side of the substrate 11 on which the stacked structure 10 is provided is mounted on a submount via solder. This makes it possible to directly radiate heat at a short distance from a light emission part. In addition, the semiconductor laser 1 including the second electrode 22 tends to have uniform current density distribution as compared to a front-surface-emitting semiconductor laser including the annular electrode. In addition, it is easy to increase the size of the area of the current injection region 14A. Accordingly, the back-emitting semiconductor laser 1 is more appropriate for high output power than the front-surface-emitting semiconductor laser.

Such a semiconductor laser 1 that makes it possible to achieve both high output power and improvement in radiation characteristics is preferably applicable to a sensing light source, a laser printer, and the like, for example. In particular, high efficacy is obtained when using the semiconductor laser 1 including the large mesa region 11M and the large current injection region 14A.

Next, a modification of the above-described embodiment is described. It is to be noted that the same components as those of the above-described embodiment are given the same reference signs, and their descriptions are omitted as appropriate.

Modification

FIG. 16 schematically illustrates a cross-sectional configuration of a semiconductor laser (a semiconductor laser 1A) according to a modification of the above-described embodiment. The semiconductor laser 1A includes a diffusion region R (an electroconductive region) in a region overlapping the contact region 16A in plan view. Except the diffusion region R, the semiconductor laser 1A has a configuration similar to the semiconductor laser 1, and achieves workings and effects that are also similar to the semiconductor laser 1.

The diffusion region R is a region in which impurities such as zinc (Zn) or the like is diffused, for example. The impurities are diffused through thermodiffusion or the like, for example. For example, the diffusion region R is selectively formed in a region in the contact layer 16 and the second light reflection layer 15, the region overlapping the contact region 16A in plan view. The diffusion region R has a higher impurity concentration than the other portion in the contact layer 16 and the second light reflection layer 15. Therefore, the diffusion region R in the contact layer 16 and the second light reflection layer 15 has a higher electrical conductivity than the other portion. This makes it possible to increase current concentration effect around the center of the current injection region 14A. It is not necessary to expand the diffusion region R to a portion of the second light reflection layer 15 (a portion on the current confining layer 14 side) in a thickness direction (in a Z direction in FIG. 16).

It is preferable that the diffusion region R do not reach the active layer 13. If the active layer 13 with highest light intensity includes the diffusion region R having high impurity concentration, the impurities absorb light and may affect a beam profile and an amount of heat generation.

In a way similar to the semiconductor laser 1A, the area of the contact region 16A in the semiconductor laser 1A according to the present modification is smaller than the area of the current injection region 14A. This makes it easier to obtain beams having a single-peak intensity distribution profile. Accordingly, it is possible to improve radiation characteristics of the beams. In addition, the region overlapping the contact region 16A includes the diffusion region R having a higher electrical conductivity than the other portion. This makes it possible to achieve even higher current density around the center of the current injection region 14A. Accordingly, it is possible to improve radiation characteristics of beams more effectively. In addition, it is possible to reduce driving voltage. This makes it possible to improve luminous efficacy.

The present technology has been described above with reference to the embodiment and the modification. However, the present technology is not limited thereto, and it is possible to make various kinds of modifications thereof. For example, each of the components of the semiconductor lasers 1 and 1A exemplified in the foregoing embodiment and the like, the arrangement thereof, the number thereof, and the like are mere examples. All of the components may not necessarily be provided, or another component may be further provided. For example, in the above-described embodiment and the like, a case where the first electrode 21 is provided on the front surface of the substrate 11 has been described. However, it is only necessary for the first electrode 21 to be in contact with the substrate 11. The first electrode 21 may be provided on the back surface of the substrate 11.

In addition, in the above-described embodiment and the like, a case where the whole surface of the second electrode 22 is in contact with the contact layer 16 has been described. However, it is also possible to provide the second electrode 22 in a manner that only a portion of the second electrode 22 is in contact with the contact layer 16. In other words, the area of the second electrode 22 may be different from the area of the contact region 16A in plan view. For example, as illustrated in FIG. 17, an insulating layer 24 may be provided on the contact layer 16. The insulating layer 24 has an opening in the contact region 16A. In this case, the area of the second electrode 22 may be larger than the area of the current injection region 14A in plan view.

In addition, with reference to FIG. 3 to FIG. 6, a case where the shape of the contact region 16A is substantially similar to the shape of the current injection region 14A in plan view has been described above. However, the shape of the contact region 16A may be different from the shape of the current injection region 14A in plan view. For example, the contact region 16A may have a circular shape in plan view, and the current injection region 14A may have a polygonal shape in plan view.

It is to be noted that the effects described in this specification are merely examples; therefore, effects in the present technology are not limited thereto, and the present technology may have other effects.

It is to be noted that the present technology may also be configured as follows.

(1)

A surface-emitting semiconductor laser including:

a substrate;

a first electrode provided in contact with the substrate;

a first light reflection layer provided over the substrate;

a second light reflection layer provided over the substrate, with the first light reflection layer being interposed between the second light reflection layer and the substrate;

an active layer provided between the second light reflection layer and the first light reflection layer;

a current confining layer that is provided between the active layer and the second light reflection layer and includes a current injection region;

a second electrode provided over the substrate, with the second light reflection layer being interposed between the second electrode and the substrate, at least a portion of the second electrode being provided at a position overlapping the current injection region; and a contact layer that is provided between the second electrode and the second light reflection layer and includes a contact region that is in contact with the second electrode, in which the contact region has a smaller area than an area of the current injection region.

(2)

The surface-emitting semiconductor laser according to (1), in which a whole area of the contact region is provided at a position overlapping the current injection region.

(3)

The surface-emitting semiconductor laser according to (1) or (2), in which the contact region and the current injection region each have a circular shape in plan view.

(4)

The surface-emitting semiconductor laser according to (1) or (2), in which the contact region and the current injection region each have a polygonal shape in plan view.

(5)

The surface-emitting semiconductor laser according to any one of (1) to (4), in which a center of the contact region in plan view is provided at a position overlapping a center of the current injection region in plan view.

(6)

The surface-emitting semiconductor laser according to any one of (1) to (5), in which current density around a center of the current injection region is higher than current density around a circumference of the current injection region.

(7)

The surface-emitting semiconductor laser according to any one of (1) to (6), in which the second light reflection layer and the contact layer have an electroconductive region provided at a position overlapping the contact region, the electroconductive region having a higher electrical conductivity than another portion.

(8)

The surface-emitting semiconductor laser according to (7), in which the electroconductive region has a higher impurity concentration than an impurity concentration of the other portion in the second light reflection layer and the contact layer.

(9)

The surface-emitting semiconductor laser according to any one of (1) to (8), in which the substrate has a mesa region in a selective region, and the first light reflection layer, the second light reflection layer, the active layer, and the current confining layer are provided in the mesa region.

(10)

The surface-emitting semiconductor laser according to any one of (1) to (9), in which the substrate is transparent to light generated in the active layer.

The present application is based on and claims priority of Japanese Patent Application JP 2017-230071 filed in the Japan Patent Office on Nov. 30, 2017, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A surface-emitting semiconductor laser, comprising:
    a substrate;
    a first electrode in contact with the substrate;
    a first light reflection layer over the substrate;
    a second light reflection layer over the substrate, wherein the first light reflection layer is between the second light reflection layer and the substrate;
    an active layer between the second light reflection layer and the first light reflection layer;
    a current confining layer between the active layer and the second light reflection layer, wherein the current confining layer includes a current injection region;
    a second electrode over the substrate, wherein
        the second light reflection layer is between the second electrode and the substrate, and
        at least a portion of the second electrode is at a position that overlaps with the current injection region; and
    a contact layer between the second electrode and the second light reflection layer, wherein
        the contact layer includes a contact region that is in contact with the second electrode,
        a center of the contact region in a plan view is at a position that does not overlap with a center of the current injection region in the plan view,
        the second light reflection layer and the contact layer have an electroconductive region at a position that overlaps with the contact region,
        the electroconductive region has a higher electrical conductivity than a portion of each of the second light reflection layer and the contact layer, and
        the portion of each of the second light reflection layer and the contact layer is different from the electroconductive region.

2. The surface-emitting semiconductor laser according to claim 1, wherein an area of the contact region is overlapped with the current injection region.

3. The surface-emitting semiconductor laser according to claim 1, wherein each of the contact region and the current injection region has a circular shape in the plan view.

4. The surface-emitting semiconductor laser according to claim 1, wherein each of the contact region and the current injection region has a polygonal shape in the plan view.

5. The surface-emitting semiconductor laser according to claim 1, wherein a current density around the center of the current injection region is higher than a current density around a circumference of the current injection region.

6. The surface-emitting semiconductor laser according to claim 1, wherein the electroconductive region has a higher impurity concentration than an impurity concentration of the portion of each of the second light reflection layer and the contact layer.

7. The surface-emitting semiconductor laser according to claim 1, wherein
    the substrate includes a selective region and a mesa region in the selective region, and
    the first light reflection layer, the second light reflection layer, the active layer, and the current confining layer are in the mesa region.

8. The surface-emitting semiconductor laser according to claim 1, wherein
    the active layer is configured to generate light, and
    the substrate is transparent to the light generated in the active layer.

9. The surface-emitting semiconductor laser according to claim 7, wherein the mesa region has a circular shape in the plan view.

10. The surface-emitting semiconductor laser according to claim 1, wherein
    the first light reflection layer includes a high refractive index layer and a low refractive index layer, and
    the high refractive index layer is on the low refractive index layer.

11. The surface-emitting semiconductor laser according to claim 1, further comprising a first spacer layer between the first light reflection layer and the active layer.

12. The surface-emitting semiconductor laser according to claim 11, further comprising a second spacer layer between the active layer and the current confining layer.

13. The surface-emitting semiconductor laser according to claim 1, wherein
    the second light reflection layer includes a high refractive index layer and a low refractive index layer, and
    the high refractive index layer is on the low refractive index layer.

14. The surface-emitting semiconductor laser according to claim 1, wherein the contact region is at a central part of the contact layer in the plan view.

15. The surface-emitting semiconductor laser according to claim 1, wherein the second electrode has a same shape as that of the contact region.

16. The surface-emitting semiconductor laser according to claim 1, wherein the second electrode has a same radius as that of the contact region.

17. The surface-emitting semiconductor laser according to claim 1, wherein the first electrode surrounds a mesa region of the substrate.

18. The surface-emitting semiconductor laser according to claim 1, further comprising an antireflective film at a back surface of the substrate.

19. The surface-emitting semiconductor laser according to claim 1, wherein an area of the contact region is smaller than an area of the current injection region.

* * * * *